(12) United States Patent
Nagaya et al.

(10) Patent No.: US 6,586,975 B2
(45) Date of Patent: Jul. 1, 2003

(54) SEMICONDUCTOR DEVICE (75) Inventors: Masafumi Nagaya, Miyazaki (JP); Masahiko Nakajikkoku, Miyazaki (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 0 days.

(21) Appl. No.: 09/977,491

(22) Filed: Oct. 16, 2001

(65) Prior Publication Data

US 2002/0050855 A1 May 2, 2002

(30) Foreign Application Priority Data

Oct. 18, 2000 (JP) ........................................ 2000-317914

(51) Int. Cl.[7] ................................................ H03L 7/00

(52) U.S. Cl. ........................................ 327/143; 327/543

(58) Field of Search ................................. 327/143, 530, 327/538–543; 323/313–315, 901

(56) References Cited

U.S. PATENT DOCUMENTS 5,528,182 A * 6/1996 Yokosawa .................... 327/143
5,969,549 A * 10/1999 Kim et al. .................... 327/143
6,060,918 A * 5/2000 Tsuchida et al. ............. 327/143

FOREIGN PATENT DOCUMENTS

JP          6-59761          4/1994

* cited by examiner

*Primary Examiner*—Terry D. Cunningham
*Assistant Examiner*—Long Nguyen
(74) *Attorney, Agent, or Firm*—Rabin & Berdo, P.C.

(57) ABSTRACT

A semiconductor device has a start-up circuit which comprises a third node (N3), a first switch (103A) which electrically connects a first node (N1) and an input terminal (102I) of a second mirror circuit (102) based on a voltage level at the third node; a second switch (103B) which electrically connects the first node and the third node based on a voltage level at an input terminal (101I) of a first current mirror circuit (101); and a third switch (103C) which electrically connects the first node and the third node based on an inverted voltage level at the third node.

12 Claims, 6 Drawing Sheets

SEMICONDUCTOR DEVICE

BACKGROUND OF THE INVENTION

Field of the Invention

The present invention generally relates to technology for a semiconductor device, and more particularly, to a start-up circuit included a constant current circuit.

This application is a counterpart of Japanese patent application, Serial Number 317914/2000, filed Oct. 18, 2000, the subject matter of which is incorporated herein by reference.

Description of the Related Art

Figure 5:
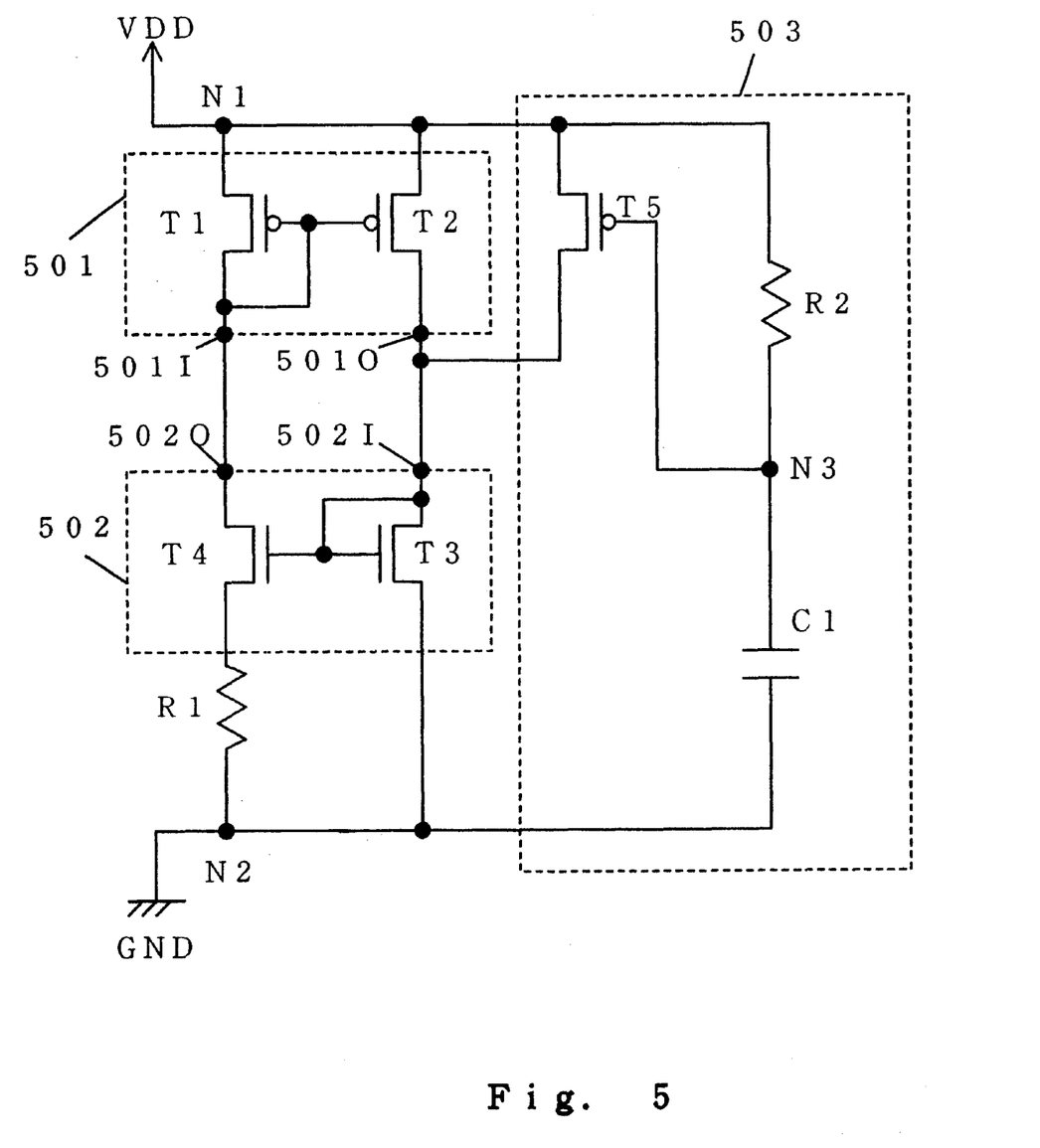
FIG. 5 is a circuit diagram showing a conventional semiconductor device.
Figure 6:
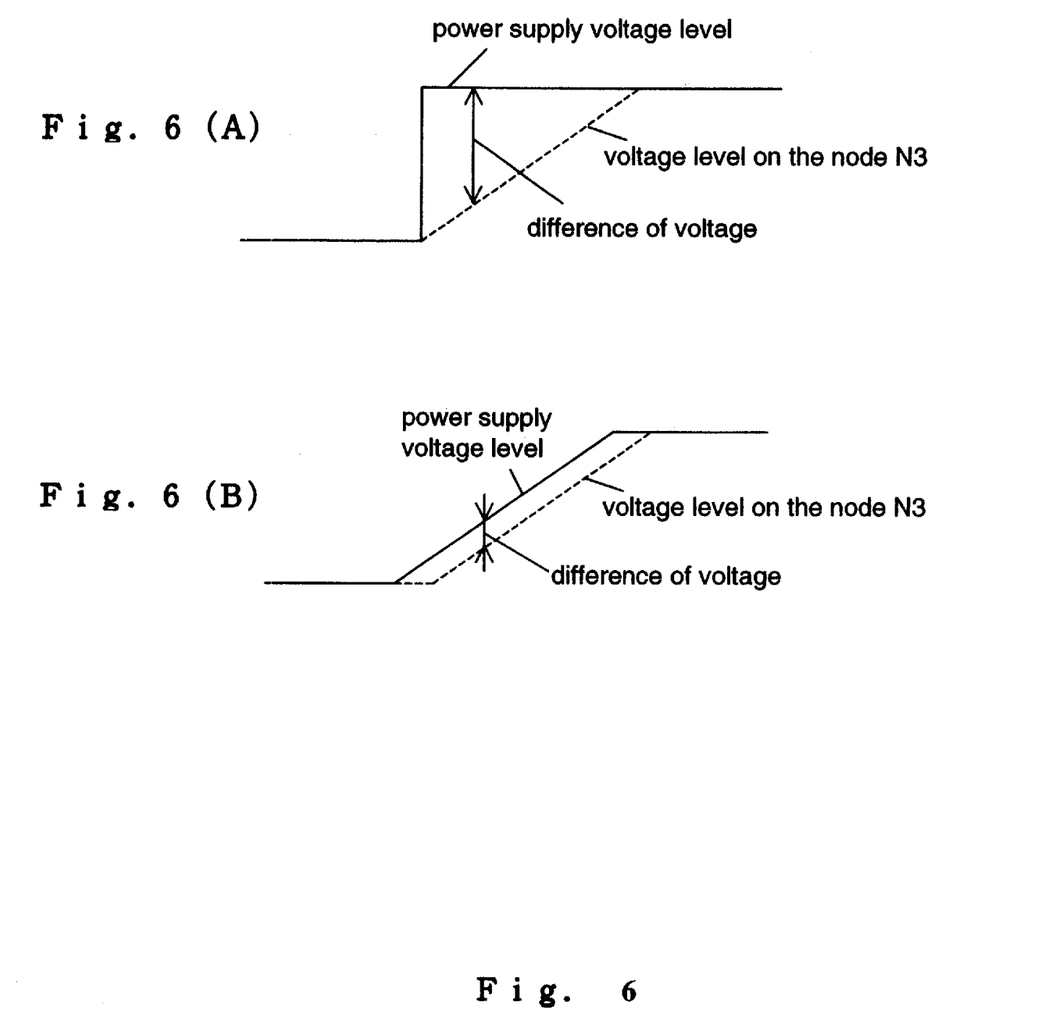
FIGS. 6A and 6B are graphs showing change of a supply voltage and a voltage on the node N3.

A conventional semiconductor device is disclosed as shown in FIGS. 5–6. FIG. 5 is a circuit diagram showing the conventional semiconductor device. FIG. 6 is a chart showing a change of a power supply voltage level and a voltage level at a node N3.

The conventional semiconductor device comprises a node N1 being supplied with a power supply voltage VDD, a node N2 being supplied with a ground voltage GND, a resistor R1, a current mirror circuit 501, a current mirror circuit 502 and a start-up circuit 503. The current mirror circuit 501 comprises an input terminal 501I, an output terminal 501O, PMOS transistor (P-channel MOSFET) T1 and PMOS transistor T2. The gate electrodes of PMOS transistors T1 and T2 are connected to each other. The current mirror circuit 502 comprises an input terminal 502I, an output terminal 502O, NMOS transistor (N-channel MOSFET) T3 and NMOS transistor T4. The gate electrodes of NMOS transistors T3 and T4 are connected to each other. The resistor R1 has two terminals, one of which is connected to the current mirror circuit 502 and the other of which is connected to the node N2. The conventional start-up circuit 503 comprises a node N3, PMOS transistor T5, a resistor R2 and a capacitor C1. PMOS transistor T5 has a gate electrode connecting to the node N3, a source electrode connecting to the node N1 and a drain electrode connecting to an input terminal 502I of the current mirror circuit 502. PMOS transistor T5 is in an ON state when the gate electrode thereof has a second voltage. PMOS transistor T5 is in an OFF state when the gate electrode thereof has a first voltage. The resistor R2 has two terminals, one of which is connected to the node N1 and the other of which is connected to the node N3. The capacitor C1 has two terminals, one of which is connected to the node N3 and the other of which is connected to the node N2.

Next, the operation of the conventional semiconductor device will be described as follows.

When power turns on in the conventional semiconductor device, the voltage on the node N3 is the second voltage. At this time, the voltage on the gate electrode of PMOS transistor T5 also is the second voltage. A current path occurs between the source electrode and the drain electrode of PMOS transistor T5. Therefore, a current path occurs between the power supply voltage node VDD and the input terminal 502I through PMOS transistor T5. The voltage on the gate electrode of NMOS transistor T3 increases. A current path occurs between the input terminal 502I and the ground voltage GND. Since the gate electrodes of NMOS transistors T3 and T4 are connected to each other, the gate electrode of NMOS transistor T4 increases. A current path occurs between the output terminal 502O and the ground voltage GND. The voltage on the gate electrode PMOS transistor T1 decreases. A current path occurs between the power supply voltage VDD and the input terminal 501I. Therefore, a current path occurs between the power supply voltage VDD and the ground voltage GND through PMOS transistor T1 and NMOS transistor T4. Since the gate electrodes of PMOS transistors T1 and T2 are connected to each other, the gate electrode of PMOS transistor T2 decreases. A current path occurs between the power supply voltage VDD and the output terminal 501O. Therefore, a current path occurs between the power supply voltage VDD and the ground voltage GND through PMOS transistor T2 and NMOS transistor T3.

On the other hand, the voltage level on the node N3 gradually increases to the first voltage. PMOS transistor T5 goes into the OFF state. Therefore, a current path between the power supply voltage node VDD to the input terminal 502I through PMOS transistor T5 is cut off. However, the conventional semiconductor device operates stably, because current at the input terminals 501I and 502I has already begun flowing.

As shown in FIG. 6(A), when an increase (a solid line) in the power supply voltage VDD occurs faster than an increase (a dotted line) in the voltage on the node N3 (speed determined by a time constant of the resistor R2 and the capacitor C1), the potential difference occurs between the power supply voltage VDD (the source electrode of PMOS transistor T5) and the node N3 (the gate electrode of PMOS transistor T5). The potential difference lets the current path between the source and drain electrodes of PMOS transistor T5 occur.

However, as shown in FIG. 6(B), when an increase (a solid line) in the supply voltage VDD occurs slowly (in other words, when the voltage level of the power supply voltage VDD increases with an increase in the time constant), the potential difference which lets the current path between the source and drain electrodes of PMOS transistor T5 occur does not occur. Therefore, the conventional semiconductor device can not work. To solve the above problem, there is a measure which lets the resistance value of the resistor R2 be high and which lets the capacitance the capacitor C1 be large. At this time, to obtain a desired increase in speed of the power supply voltage VDD, which is 500 ms (microsecond), the semiconductor device must have the resistor R2, the resistor value of which is 5G $\Omega$ (gigaohm) and the capacitor C1, the capacitance of which is 100 PF (picofarad).

SUMMARY OF THE INVENTION

It is an object of the present invention to provide a semiconductor device that may be driven stably even if the increase in speed of the supply voltage changes.

It is another object of the present invention to provide a semiconductor device that may be driven by low current.

It is another object of the present invention to provide a semiconductor device that may be driven by low voltage.

It is further object of the present invention to provide a semiconductor device that may be driven at fast speed.

According to one aspect of the present invention, for achieving the above object, there is provided a semiconductor device, with a first node which has a first voltage; a second node which has a second voltage, wherein the second voltage is lower than the first voltage; a first current mirror circuit which has an input terminal and an output terminal, wherein the first current mirror circuit is coupled with the first node; a second current mirror circuit which has an input terminal and an output terminal, wherein the input terminal of the second current mirror circuit is coupled with the output terminal of the first current mirror circuit, wherein the output terminal of the second current mirror circuit is coupled with said input terminal of the first current mirror circuit and wherein the second current mirror circuit is coupled with said second node; and a start-up circuit which comprises a third node, a first switch which electrically connects the first node and the input terminal of the second mirror circuit based on a voltage level at the third node, a second switch which electrically connects the first node and the third node based on a voltage level at the input terminal of the first current mirror circuit, and a third switch which electrically connects the first node and the third node based on an inverted voltage of the voltage level at the third node.

The above and further objects and novel features of the invention will more fully appear from the following detailed description, appended claims and the accompanying drawings.

DETAILED DESCRIPTION OF THE PREFERRED EMBODIMENTS

In what follows, the present invention will be explained with embodiments of the present invention. However, the invention is not limited to the specific embodiments. Moreover, not all the combinations of the characteristics of the present invention described in the embodiments are essential to the problem solving means provided by the present invention.

FIRST PREFERRED EMBODIMENT

Figure 1:
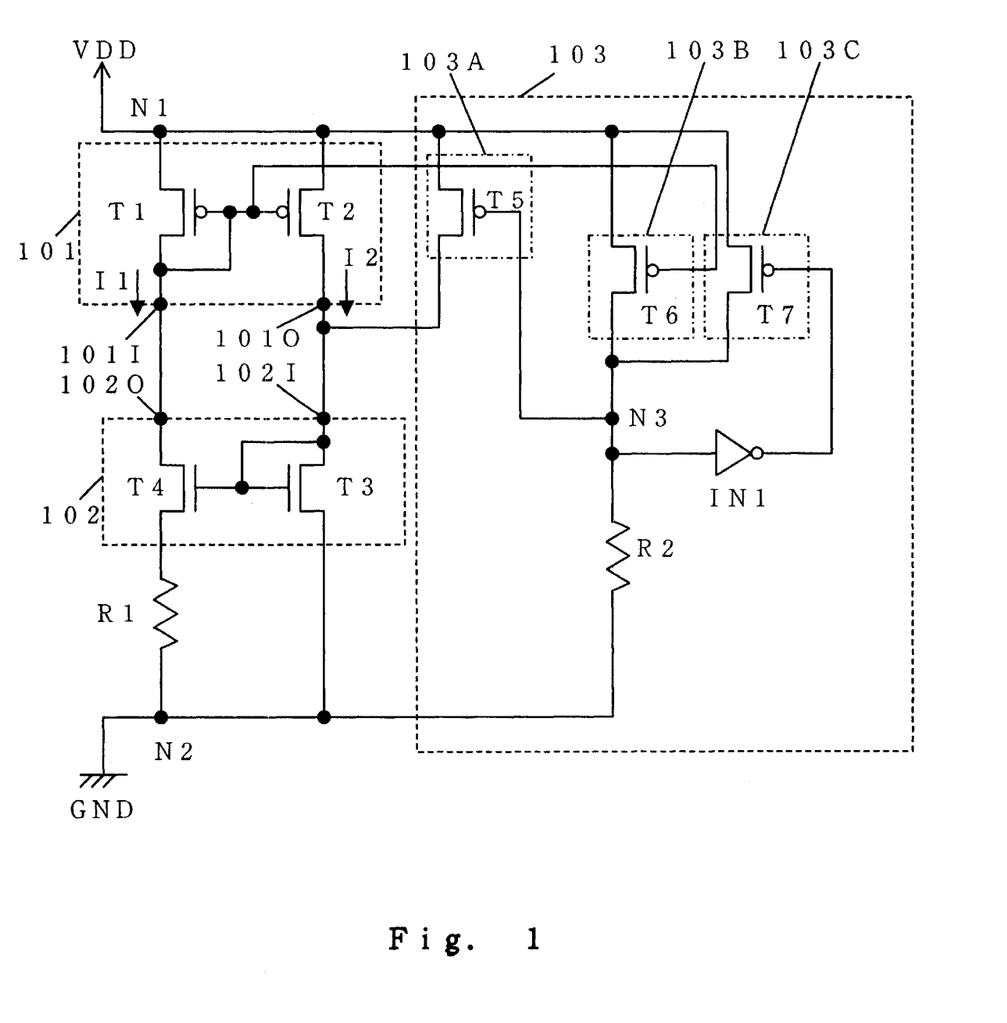
FIG. 1 is a circuit diagram showing a semiconductor device according to a first preferred embodiment of the present invention.
Figure 2:
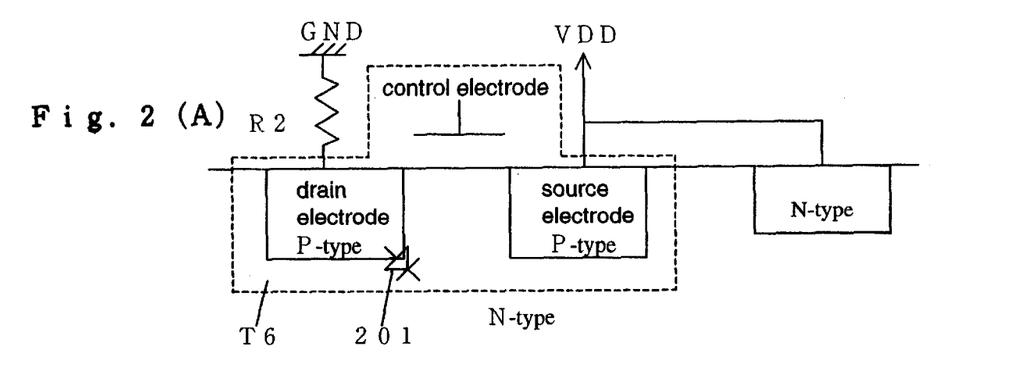
FIG. 2A is a concept diagram showing a connection relationship of a start-up circuit and FIG. 2B is a graph showing change of a supply voltage and a voltage on the node N3.

A semiconductor device according to a first preferred embodiment of the present invention will be described with reference to FIGS. 1–2. FIG. 1 is a circuit diagram showing the semiconductor device according to the first preferred embodiment of the present invention. FIG. 2 is a concept diagram showing a connection relationship of a start-up circuit and a graph showing change of a supply voltage and a voltage on the node N3.

First, the semiconductor device according to the first preferred embodiment of the present invention comprises a node N1, a node N2, a current mirror circuit 101, a current mirror circuit 102, a resistor R1 and a start-up circuit 103. The node N1 is coupled with a power supply voltage node VDD which supplies the node N1 with a first voltage, i.e. a power supply voltage VDD or a driving voltage VDD. The first voltage has a value such as 5 V (Volts). The node N2 is coupled with a ground node GND which supplies the node N2 with a second voltage, i.e. a standard voltage GND or a ground voltage GND. The second voltage has a value such as 0 V.

The current mirror circuit 101 comprises an input terminal 101I, an output terminal 101O, first conductive type transistors T1 and T2, i.e. PMOS transistor (p-channel MOSFETs). A PMOS transistor comprises a control electrode (a gate electrode), a first electrode (a source electrode or a drain electrode) and a second electrode (a drain electrode or a source electrode). When the difference in voltage between the source electrode and the gate electrode of a PMOS transistor exceeds a certain amount of voltage (a gate-source voltage VGS), current flows between the source electrode and the drain electrode (in other words, a current path occurs between the source and drain electrodes). When the difference in voltage between the source electrode and the gate electrode of the PMOS transistor does not exceed the gate-source voltage VGS, current does not flow between the source electrode and the drain electrode. A source electrode of PMOS transistor T1 is connected to the node N1. PMOS transistor T1 has a gate electrode and a drain electrode connected to the input terminal 101I. A source electrode of PMOS transistor T2 is connected to the node N1. A gate electrode of PMOS transistor T2 is connected to the gate electrode of PMOS transistor T1. A drain electrode of PMOS transistor T2 is connected to the output terminal 101O.

The current mirror circuit 102 comprises an input terminal 102I, an output terminal 102O, second conductive type transistors T3 and T4, i.e. NMOS transistor (N-channel MOSFETs). An NMOS transistor comprises a control electrode (a gate electrode), a first electrode (a source electrode or a drain electrode) and a second electrode (a drain electrode or a source electrode). When the difference of voltage between the source electrode and the gate electrode of an NMOS transistor exceeds a certain amount of voltage (a gate-source voltage VGS), current flows between the source electrode and the drain electrode. When the difference of voltage between the source electrode and the gate electrode of the NMOS transistor does not exceed the gate-source voltage VGS, current does not flow between the source electrode and the drain electrode. A source electrode of NMOS transistor T3 is connected to the node N2. NMOS transistor T3 has a gate electrode and a drain electrode connected to the input terminal 102I. A source electrode of NMOS transistor T4 is connected to the resistor R1. A gate electrode of NMOS transistor T4 is connected to the gate electrode of NMOS transistor T3. A drain electrode of NMOS transistor T4 is connected to the output terminal 102O. The input terminal 102I of the current mirror circuit 102 is coupled with the output terminal 101O of the current mirror circuit 101. The output terminal 102O of the current mirror circuit 102 is coupled with the input terminal 101I of the current mirror circuit 101.

The resistor R1 has two terminals. One terminal is connected to the source electrode of NMOS transistor T4, the other terminal is connected to the node N2. The resistor R1 may comprise a PMOS or NMOS transistor. When the resistor R1 comprises an NMOS transistor, a gate electrode is connected to the node N1, a source electrode is connected to the node N2 and a drain electrode is connected to the source electrode of NMOS transistor T4. The intensity of a current I1 flowing at the input terminal 101I and the intensity of a current I2 flowing at the output terminal 101O depend on a current gain of the current mirror circuit 102. Further, the intensity of the current I1 depends on the resistance value of the resistor R1.

The start-up circuit 103 comprises a node N3, a switch 103A, a switch 103B, a switch 103C, a resistor R2 and an inverter IN1. The switch 103A is connected to the nodes N1 and N3 and the input terminal 102I of the current mirror circuit 102. The switch 103B is connected to the nodes N1 and N3 and the input terminal 101I of the current mirror circuit 101. The switch 103C is connected to the nodes N1 and N3 and the inverter IN1. The inverter IN1 is connected to the node N3 and the switch 103C. The resistor R2 is connected to the nodes N3 and N2.

The switch 103A comprises PMOS transistor T5, the switch 103B comprises PMOS transistor T6 and the switch 103C comprises PMOS transistor T7. Each of the switches has an ON state and an OFF state. Each of the switches goes into an ON state when the difference of voltage between the source electrode and the gate electrode of PMOS transistor exceeds a certain amount of voltage (a gate-source voltage VGS). The ON state means that current flows between the source and drain electrodes of PMOS transistor. Each of switches goes into an OFF state when the difference of voltage between the source electrode and the gate electrode of PMOS transistor does not exceed the gate-source voltage VGS. The OFF state means that current does not flow between the source and drain electrodes of the PMOS transistor.

A gate electrode of PMOS transistor T5 is connected to the node N3. A source electrode is connected to the node N1 and a drain electrode is connected to the input terminal 102I of the current mirror circuit 102. A gate electrode of PMOS transistor T6 is connected to the gate electrode of PMOS transistor T1 or T2 (or the input terminal 101I). PMOS transistor T1 and PMOS transistor T6 comprise a current mirror circuit. A source electrode of PMOS transistor T6 is connected to the node N1 and a drain electrode thereof is connected to the node N3. A gate electrode of PMOS transistor T7 is connected to the inverter IN1. A source electrode of PMOS transistor T7 is connected to the node N1 and a drain electrode is connected to the node N3.

The resistor R2 has two terminals. One terminal is connected to the node N3 and the other terminal is connected to the node N2. The resistor R2 may comprise a PMOS or NMOS transistor. When the resistor R2 comprises an NMOS transistor, a gate electrode is connected to the node N1, a source electrode is connected to the node N2 and a drain electrode is connected to the node N3.

The inverter IN1 has two terminals. One terminal is connected to the gate electrode of PMOS transistor T7 and the other terminal is connected to the node N3. The inverter IN1 may comprise PMOS and NMOS transistors. When the inverter IN1 comprises MOS transistors, the gate electrodes of PMOS and NMOS transistors are connected to the node N3, the drain electrodes of PMOS and NMOS transistors are connected to the gate electrode of PMOS transistor T7, a source electrode of PMOS transistor is connected to the node N1 and a source electrode of NMOS transistor is connected to the node N2.

On the other hand, as shown in FIG. 2(A), PMOS transistor T6 can be connected. PMOS transistor T6 has the drain and source electrodes as P-type diffusion regions which are formed on an N-type substrate. The source electrode and the N-type substrate are supplied with the power supply voltage VDD. The drain electrode is connected to the resistor R2, one terminal of which is supplied with the ground voltage GND. The parasitic diode 201 is formed at the boundary between the drain electrode and the N-type substrate. As shown in FIG. 2(B), when the level of the power supply voltage in the stable condition rapidly drops in a moment, voltage on the node N3 also rapidly drops. However, when the power supply voltage returns to its previous level, voltage on the node N3 still does not return to its previous level because of the parasitic diode 201. Therefore, the difference of voltage which lets PMOS transistor T5 be in an ON state occurs between the source and drain electrodes thereof. Current further flows on the input terminals 101I and 102I. The excess current causes unsatisfactory operation in the circuit using this semiconductor device. Therefore, the start-up circuit has the inverter IN1 which reverses the voltage on the node N3. The inverter IN1 can be driven by this voltage, which is lower than the necessary voltage to let PMOS transistor T5 be in an ON state. The start-up circuit can quickly flow current on the node N3 and quickly increases the voltage on the node N3, before PMOS transistor T6 goes into the ON state.

Next, the operation of the semiconductor device according to the first preferred embodiment of the present invention will be described as follows.

When power turns on in the semiconductor device, the switch 103B is in an OFF state and the voltage on the node N3 is a second voltage. The inverter IN1 inverts the second voltage and supplies a first voltage to the switch 103C. Therefore, the switch 103C is in an OFF state. To put it concretely, the difference in voltage between the source electrode and the gate electrode of PMOS transistor T7 does not exceed the gate-source voltage VGS. Current does not flow between the source electrode and the drain electrode of PMOS transistor T7. Therefore, a current path between the power supply voltage node VDD and the node N3 through PMOS transistor T7 does not occur. On the other hand, since PMOS transistor T6 is in the OFF state, a current path between the power supply voltage node VDD and the node N3 through PMOS transistor T6 does not occur either. Therefore, the voltage on the node N3 continues to be the second voltage.

Since the node N3 and the gate electrode PMOS transistor T5 are connected with each other, the voltage on the gate electrode of PMOS T5 is also the second voltage. Therefore, the switch 103A is in an ON state. In other words, the gate-source voltage VGS occurs between the gate and source electrodes of PMOS transistor T5 and a current path occurs between the source and drain electrodes. Therefore, a current path between the power supply voltage node VDD and the input terminal 102I through PMOS transistor T5 occurs.

Since the input terminal 102I and the gate electrode of NMOS transistor T3 are connected with each other, the voltage on the gate electrode of NMOS transistor T3 increases. Therefore, the gate-source voltage VGS occurs between the gate and source electrodes of NMOS transistor T3 and a current path occurs between the source and drain electrodes. A current path occurs between the input terminal 102I and the ground voltage node GND.

Since the gate electrodes of NMOS transistors T3 and T4 are connected with each other, the voltage on the gate electrode of NMOS transistor T4 also increases. Therefore, the gate-source voltage VGS occurs between the gate and source electrodes of NMOS transistor T4 and a current path occurs between the source and drain electrodes. A current path occurs between the output terminal 102O and the ground voltage node GND.

Since the output terminal 102O and the input terminal 101I are connected with each other, the voltage on the gate electrode of PMOS transistor T1 decreases. Therefore, the gate-source voltage VGS occurs between the gate and source electrodes of PMOS transistor T1 and a current path occurs between the source and drain electrodes. A current path occurs between the power supply voltage node VDD and the input terminal 101I. Thus, a current path occurs between the power supply voltage node VDD and the ground voltage node GND through PMOS transistor T1 and NMOS transistor T4.

Since the gate electrodes of PMOS transistors T1 and T2 are connected with each other, the voltage on the gate electrode of PMOS transistor T2 also decreases. Therefore, the gate-source voltage VGS occurs between the gate and source electrodes of PMOS transistor T1 and a current path occurs between the source and drain electrodes. A current path occurs between the power supply voltage node VDD and the output terminal 101O. Thus, a current path occurs between the power supply voltage node VDD and the ground voltage node GND through PMOS transistor T2 and NMOS transistor T3.

On the other hand, since the gate electrodes of PMOS transistors T1 and T6 are connected with each other, the voltage level on the gate electrode of PMOS transistor T6 also decreases. Therefore, the switch 103B is in an ON state. In other words, the gate-source voltage VGS occurs between the gate and source electrodes of PMOS transistor T6 and a current path occurs between the source and drain electrodes. Therefore, a current path occurs between the power supply voltage node VDD and the node N3 through PMOS transistor T6. The voltage on the node N3 increases gradually to a certain voltage. The inverter IN1 is driven by the voltage level at node N3, which is lower than the necessary voltage level to let PMOS transistor T5 be in an ON state. At this time, voltage on the gate electrode of PMOS transistor T7 is the second voltage. Therefore, PMOS transistor T7 is in the ON state. In other words, the gate-source voltage VGS occurs between the gate and source electrodes of PMOS transistor T7 and a current path occurs between the source and drain electrodes. Therefore, a current path occurs between the power supply voltage node VDD and the node N3 through PMOS transistor T7. Current flows toward the node N3 from the node N1. A voltage level on the node N3 rapidly increases to the first voltage.

When the voltage level on node N3 becomes the first voltage level, the switch 103A goes into the OFF state. To put it concretely, the current path does not occur between the source and drain electrodes of PMOS transistor T5. Therefore, a current path does not occur between the power supply voltage node VDD and the input terminal 102I through PMOS transistor T5.

However, the current has been already flowing at the input terminal 102I. Therefore, the semiconductor device according to the first preferred embodiment of the present invention can stably operate after the current path cuts off.

The semiconductor device according to the first preferred embodiment of the present invention has the following effects.

According to the voltage level on the input terminal 101I, a current path occurs between the power supply voltage node VDD and the node N3 through PMOS transistor T6. After the semiconductor device of the present invention reaches the stable operation based on the flowing current at the input terminals 101I and 102I, the voltage level at the node N3 increases to the certain voltage level which lets PMOS transistor T5 be ON state. Therefore, the semiconductor device according to the first preferred embodiment of the present invention can operate stably without the adjustment of the time constant of the resistor, even if the power supply voltage changes.

Furthermore, the semiconductor device according to the first preferred embodiment of the present invention has the inverter which reverses the voltage level at the node N3 and is driven by the lower voltage level. The semiconductor device according to the first preferred embodiment can quickly cause a flow of current on the node N3 and quickly raise the voltage level at the node N3, before PMOS transistor T5 goes into the ON state. Therefore, the semiconductor device according to the first preferred embodiment can operate stably, even if the power supply voltage rapidly drops in a moment.

Furthermore, the source electrode of PMOS transistor T6 is directly connected to the node N1, which is supplied with the power supply voltage. Therefore, the semiconductor device according to the first preferred embodiment can operate quickly.

SECOND EMBODIMENT

Figure 3:
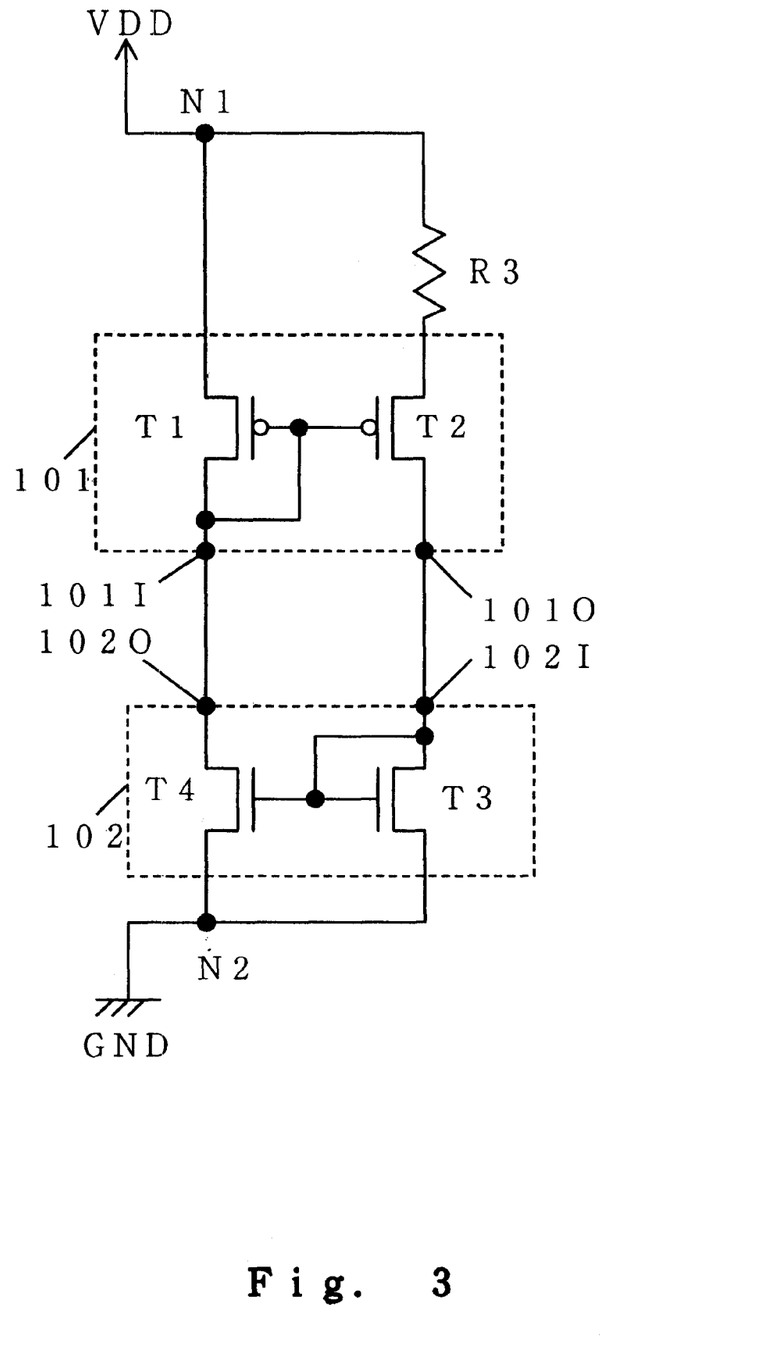
FIG. 3 is a partial circuit diagram showing a semiconductor device according to a second preferred embodiment of the present invention.

A semiconductor device according to a second preferred embodiment of the present invention will be described with reference to FIG. 3. FIG. 3 is a circuit diagram showing a part of the semiconductor device according to the second preferred embodiment of the present invention. The start-up circuit 103 is omitted from FIG. 3. Like elements are given like or corresponding reference numerals in the first through third preferred embodiments. Thus, dual explanations of the same elements are avoided.

The semiconductor device according to the second preferred embodiment of the present invention has a resistor R3 which is supplied between the node N1 and PMOS transistor T2, instead of the resistor R1 according to the first preferred embodiment. The resistor R3 has two terminals. One terminal is connected to the node N1 and the other terminal is connected to the source electrode of the PMOS transistor T2. The resistor R3 may comprise a PMOS or NMOS transistor. When the resistor R3 comprises an NMOS transistor, a gate electrode and a source electrode are connected to the node N1 and a drain electrode is connected to the source electrode of the PMOS transistor T2. Therefore, the power supply voltage VDD is indirectly supplied with the source electrode of PMOS transistor T2 through the resistor R3. The source electrode of NMOS transistor T4 is directly connected to the node N2.

The semiconductor device according to the second preferred embodiment of the present invention can have the same effects described for the first preferred embodiment of the present invention.

Furthermore, the semiconductor device according to the second preferred embodiment of the present invention can flow current at the input terminal 101I of the current mirror circuit 101 on a massive scale toward the node N2.

THIRD EMBODIMENT

Figure 4:
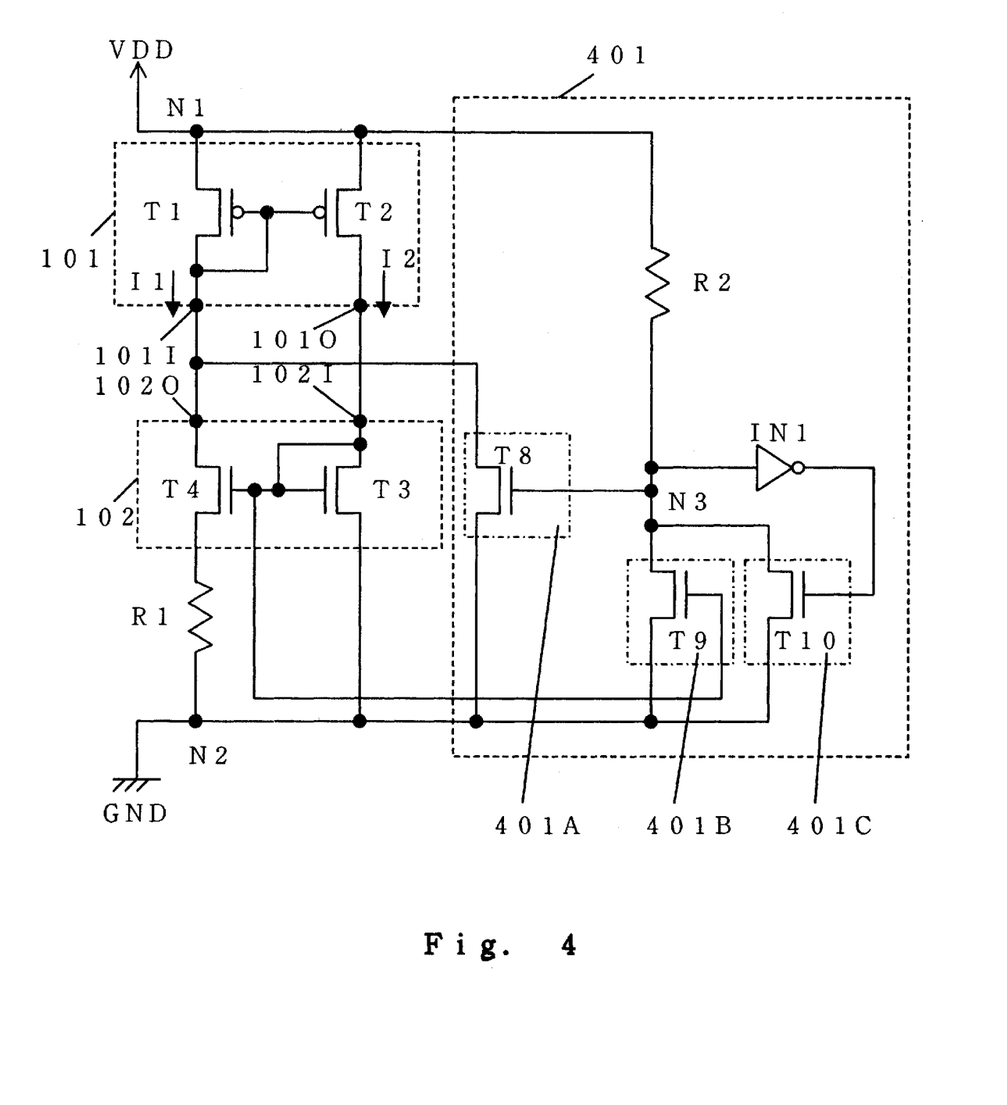
FIG. 4 is a circuit diagram showing a semiconductor device according to a third preferred embodiment of the present invention.

A semiconductor device according to a third preferred embodiment of the present invention will be described with reference to FIG. 4. FIG. 4 is a circuit diagram showing the semiconductor device according to the third preferred embodiment of the present invention. Like elements are given like or corresponding reference numerals in the first and second preferred embodiments. Thus, dual explanations of the same elements are avoided.

The start-up circuit 401 comprises a node N3, a switch 401A, a switch 401B, a switch 401C, a resistor R2 and an inverter IN1. The switch 401A is connected to the nodes N2 and N3 and the input terminal 101I of the current mirror circuit 101. The switch 401B is connected to the nodes N2 and N3 and the input terminal 102I of the current mirror circuit 102. The switch 401C is connected to the nodes N2 and N3 and the inverter IN1. The inverter IN1 is connected to the node N3 and the switch 401C. The resistor R2 is connected to the nodes N1 and N3.

The switch 401A comprises NMOS transistor T8, the switch 401B comprises NMOS transistor T9 and the switch 401C comprises NMOS transistor T10. Each of these switches has an ON state and an OFF state. Each of the switches becomes in an ON state when the difference of voltage between the source electrode and the gate electrode of the NMOS transistor exceeds a certain amount of voltage (a gate-source voltage VGS). The ON state means that current flows between the source and drain electrodes of the NMOS transistor. Each of switches becomes in an OFF state when the difference of voltage between the source electrode and the gate electrode of the NMOS transistor does not exceed the gate-source voltage VGS. The OFF state means that current does not flow between the source and drain electrodes of the NMOS transistor.

A gate electrode of NMOS transistor T8 is connected to the node N3. A source electrode is connected to the node N2 and a drain electrode is connected to the input terminal 101I of the current mirror circuit 101. A gate electrode of NMOS transistor T9 is connected to the gate electrode of NMOS transistor T3 or T4 (or the input terminal 102I). NMOS transistor T4 and NMOS transistor T9 comprise a current mirror circuit. A source electrode of NMOS transistor T9 is connected to the node N2 and a drain electrode is connected to the node N3. A gate electrode of NMOS transistor T10 is connected to the inverter IN1. A source electrode is connected to the node N2 and a drain electrode is connected to the node N3.

The resistor R2 has two terminals. One terminal is connected to the node N3 and the other terminal is connected to the node N1.

The inverter IN1 has two terminals. One terminal is connected to the gate electrode of NMOS transistor T10 and the other terminal is connected to the node N3.

Next, the operation of the semiconductor device according to the third preferred embodiment of the present invention will be described as follows.

When power turns on in the semiconductor device, the switch 401B is in an OFF state and the voltage on the node N3 is a first voltage. The inverter IN1 inverts the first voltage level and supplies second voltage to the switch 401C. Therefore, the switch 401C is in an OFF state. To put it concretely, the difference of voltage between the source electrode and the gate electrode of NMOS transistor T10 does not exceed the gate-source voltage VGS. Current does not flows between the source electrode and the drain electrode of NMOS transistor T10. Therefore, a current path between the node N3 and the ground voltage node GND through NMOS transistor T10 does not occur. On the other hand, since NMOS transistor T9 is in the OFF state, a current path between the node N3 and the ground voltage node GND through NMOS transistor T9 does not occur either. Therefore, the voltage on the node N3 is maintained at the first voltage.

Since the node N3 and the gate electrode NMOS transistor T8 are connected with each other, the voltage on the gate electrode of NMOS T8 is also the first voltage. Therefore, the switch 401A is in an ON state. In other words, the gate-source voltage VGS occurs between the gate and source electrodes of NMOS transistor T8 and a current path occurs between the source and drain electrodes. Therefore, a current path between the ground voltage node GND and the input terminal 101I through NMOS transistor T8 occurs.

Since the input terminal 101I and the gate electrode of PMOS transistor T1 are connected with each other, the voltage on the gate electrode of PMOS transistor T1 decreases. Therefore, the gate-source voltage VGS occurs between the gate and source electrodes of PMOS transistor T1 and a current path occurs between the source and drain electrodes. A current path occurs between the power supply voltage node VDD and the input terminal 101I.

Since the gate electrodes of PMOS transistors T1 and T2 are connected with each other, the voltage on the gate electrode of PMOS transistor T2 also decreases. Therefore, the gate-source voltage VGS occurs between the gate and source electrodes of PMOS transistor T2 and a current path occurs between the source and drain electrodes. A current path occurs between the power supply voltage node VDD and the output terminal 101O.

Since the output terminal 101O and the input terminal 102I are connected with each other, the voltage on the gate electrode of NMOS transistor T3 increases. Therefore, the gate-source voltage VGS occurs between the gate and source electrodes of NMOS transistor T3 and a current path occurs between the source and drain electrodes. A current path occurs between the input terminal 102I and the ground voltage node GND. Thus, a current path occurs between the power supply voltage node VDD and the ground voltage node GND through PMOS transistor T2 and NMOS transistor T3.

Since the gate electrodes of NMOS transistors T3 and T4 are connected with each other, the voltage on the gate electrode of NMOS transistor T4 also increases. Therefore, the gate-source voltage VGS occurs between the gate and source electrodes of NMOS transistor T4 and a current path occurs between the source and drain electrodes. A current path occurs between the output terminal 102O and the ground voltage node GND. Thus, a current path occurs between the power supply voltage node VDD and the ground voltage node GND through PMOS transistor T1 and NMOS transistor T4.

On the other hand, since the gate electrodes of NMOS transistors T4 and T9 are connected with each other, the voltage level on the gate electrode of NMOS transistor T6 also increases. Therefore, the switch 401B is in an ON state. In other words, the gate-source voltage VGS occurs between the gate and source electrodes of NMOS transistor T9 and a current path occurs between the source and drain electrodes. Therefore, a current path occurs between the ground voltage node GND and the node N3 through NMOS transistor T9. The voltage on the node N3 decreases gradually to a certain voltage. The inverter IN1 is driven by a voltage level which is lower than the necessary voltage level to let NMOS transistor T8 be in the ON state. At this time, the voltage on the gate electrode of the NMOS transistor T10 is first voltage. Therefore, NMOS transistor T10 is in the ON state. In other words, the gate-source voltage VGS occurs between the gate and source electrodes of the NMOS transistor T10 and a current path occurs between the source and drain electrodes. Therefore, a current path occurs between the ground voltage node GND and the node N3 through NMOS transistor T10. Current flows toward the node N2 from the node N3. A voltage level on the node N3 rapidly decreases to the second voltage.

When the voltage level on node N3 becomes the second voltage level, the switch 401A becomes in the OFF state. To put it concretely, the current path does not occur between the source and drain electrodes of NMOS transistor T8. Therefore, the current path does not occur between the ground voltage node GND and the input terminal 101I through NMOS transistor T8.

However, the current is already flowing at the input terminal 101I. Therefore, the semiconductor device according to the third preferred embodiment of the present invention can stably operate after the current path cuts off.

The semiconductor device according to the third preferred embodiment of the present invention has the effects of those of the first preferred embodiment. It goes without saying that the third preferred embodiment of the present invention can be combined with the second preferred embodiment. In that case, the semiconductor device according to the third preferred embodiment is capable of having the effect described for the second preferred embodiment.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A semiconductor device comprising:
    a first node which is provided a first voltage;
    a second node which is provided a second voltage, wherein said second voltage is lower than said first voltage;
    a first current mirror circuit which has an input terminal and an output terminal, wherein said first current mirror circuit is coupled with said first node;
    a second current mirror circuit which has an input terminal and an output terminal, wherein said input terminal of said second current mirror circuit is coupled with said output terminal of said first current mirror circuit, wherein said output terminal of said second current mirror circuit is coupled with said input terminal of said first current mirror circuit and wherein said second current mirror circuit is coupled with said second node; and
    a start-up circuit which includes
        a third node,
        an inverter which is connected to said third node,
        a first switch which connects said first node and said input terminal of said second current mirror circuit based on voltage on said third node,
        a first transistor to which is located between the first and third nodes, and which supplies a current at the first node to the third node based on a voltage on the input terminal of the first current mirror circuit, and
        a second switch which connects said first node and said third node based on an inverted voltage of the voltage on said third node.

2. The semiconductor device in accordance with claim 1, wherein said first switch includes a first transistor has a control electrode coupling with said third node, a first electrode coupling with said first node and a second electrode coupling with said input terminal of said second current mirror circuit, and
    wherein said first transistor which has a control electrode coupling with said input terminal of said first current mirror circuit, a first electrode coupling with said first node and a second electrode coupling with said third node, and
    wherein said second switch includes a third transistor which has a control electrode coupling with said third node through said inverter, a first electrode coupling with said first node and a second electrode coupling with said third node.

3. The semiconductor device in accordance with claim 2, further comprising a resistor, wherein
    said first current mirror circuit includes
        a fourth transistor which has a first electrode coupling with said first node and a control electrode and a second electrode each coupling with the first current mirror ciruit input terminal, and
        a fifth transistor which has a first electrode coupling with said node, a control electrode coupling with said control electrode of said fourth transistor and a second electrode coupling with the first current mirror circuit output terminal; and
    wherein said second current mirror circuit includes
        a sixth transistor, said sixth transistor having a first electrode coupling with said second node and a control and a second electrodes coupling with the second current mirror circuit input terminal, and
        a seventh transistor which has a first electrode coupling with said second node through said resistor, a control electrode coupling with said control electrode of said sixth transistor and a second electrode coupling with the second current mirror circuit output terminal.

4. The semiconductor device in accordance with claim 3, wherein said first to fifth transistors are PMOS transistors and wherein said sixth and seventh transistors are NMOS transistors.

5. The semiconductor device in accordance with claim 2, further comprising a resistor, wherein
    said first current mirror circuit includes
        a fourth transistor, said fourth transistor having a first electrode coupling with said first node, and a control electrode and a second electrode both coupling with the first current mirror circuit input terminal, and
        a fifth transistor which has a first electrode coupling with said first node through said resistor, a control electrode coupling with said control electrode of said fourth transistor and a second electrode coupling with said the first current mirror circuit output terminal; and
    wherein said second current mirror circuit includes
        a sixth transistor which has a first electrode coupling with said second node, and a control electrode and a second electrode each coupling with the second current mirror circuit input terminal, and
        a seventh transistor which has a first electrode coupling with said second node, a control electrode coupling with said control electrode of said sixth transistor and a second electrode coupling with the second current mirror circuit output terminal.

6. The semiconductor device in accordance with claim 5, wherein said first to fifth transistors are PMOS transistors and wherein said sixth and seventh transistors are NMOS transistors.

7. A semiconductor device, comprising:
    a first node which is provided a first voltage;
    a second node which is provided a second voltage, wherein said second voltage is lower than said first voltage;
    a first current mirror circuit which is coupled with said first node;
    a second current mirror circuit which is coupled with said second node, wherein said second current mirror circuit is coupled with said first current mirror circuit through a third node and a fourth node;

a start-up circuit which includes
a fifth node,
an inverter which is connected to said fifth node,
a first switch which connects said first node and said fourth node based on voltage on said fifth node,
a first transistor which is located between the first and fifth nodes, and which supplies a current of the first node to the fifth node based on a voltage on the third node, and
a second switch which connects said first node and said fifth node based on an inverted voltage of the voltage on said fifth node.

8. The semiconductor device in accordance with claim 7, wherein said first switch includes a second transistor which has a control electrode coupling with said fifth node, a first electrode coupling with said first node and a second electrode coupling with said fourth node, and wherein said first transistor has a control electrode coupling with said third node, a first electrode coupling with said first node and a second electrode coupling with said fifth node, and wherein said second switch includes a third transistor which has a control electrode coupling with said fifth node through said inverter, a first electrode coupling with said first node and a second electrode coupling with said fifth node.

9. The semiconductor device in accordance with claim 8, further comprising a resistor, wherein first current mirror circuit has
a fourth transistor which includes a first electrode coupling with said first node and a control and a second electrodes coupling with said third node, and
a fifth transistor which has a first electrode coupling with said first node, a control electrode coupling with said control electrode of said fourth transistor and a second electrode coupling with said fourth node; and wherein said second current mirror circuit includes
a sixth transistor which has a first electrode coupling with said second node and a control and a second electrodes coupling with said fourth node, and
a seventh transistor which has a first electrode coupling with said second node through a resistor, a control electrode coupling with said control electrode of said sixth transistor and a second electrode coupling with said third node.

10. The semiconductor device in accordance with claim 9, wherein said first to fifth transistors are PMOS transistors and wherein said sixth and seventh transistors are NMOS transistors.

11. The semiconductor device in accordance with claim 8, further comprising a resistor, wherein first current mirror circuit includes a fourth transistor which has a first electrode coupling with said first node and a control and a second electrodes coupling with said third node, and a fifth transistor which has a first electrode coupling with said first node through said resistor, a control electrode coupling with said control electrode of said fourth transistor and a second electrode coupling with said fourth node; and wherein said second current mirror circuit includes a sixth transistor which has a first electrode coupling with said second node and a control and a second electrodes coupling with said fourth node, and a seventh transistor which has a first electrode coupling with said second node, a control electrode coupling with said control electrode of said sixth transistor and a second electrode coupling with said third node.

12. The semiconductor device in accordance with claim 11, wherein said first to fifth transistors are PMOS transistors and wherein said sixth and seventh transistors are NMOS transistors.

* * * * *